United States Patent
Malaviya et al.

(12) 
(10) Patent No.: US 6,215,840 B1
(45) Date of Patent: Apr. 10, 2001

(54) METHOD AND APPARATUS FOR SEQUENTIAL MEMORY ADDRESSING

(75) Inventors: Shashi D. Malaviya, Hopewell Junction; Olivier Prache, Pleasantville, both of NY (US)

(73) Assignee: eMagin Corporation, Hopewell Junction, NY (US)

( * ) Notice: Subject to any disclaimer, the term of this patent is extended or adjusted under 35 U.S.C. 154(b) by 0 days.

(21) Appl. No.: 09/304,259

(22) Filed: May 6, 1999

Related U.S. Application Data (60) Provisional application No. 60/084,495, filed on May 6, 1998.

(51) Int. Cl.$^7$ .................................................. G11C 19/28

(52) U.S. Cl. .............................. 377/57; 377/63; 327/271; 327/272; 327/337

(58) Field of Search ....................... 377/57, 63; 327/271, 327/272, 337

(56) References Cited

U.S. PATENT DOCUMENTS

| | | | |
|---|---|---|---|
| 3,579,273 | 5/1971 | Cook | 307/221 |
| 3,643,106 | 2/1972 | Berwin et al. | 307/221 C |
| 3,676,711 | 7/1972 | Ahrons | 307/293 |
| 3,708,690 | 1/1973 | Paivinen | 307/221 R |
| 3,789,239 | 1/1974 | Heeren | 307/221 C |
| 3,852,625 | 12/1974 | Kubo | 326/97 |
| 3,912,944 | 10/1975 | Mulder et al. | 307/238 |
| 4,017,741 | 4/1977 | Briggs | 377/79 |
| 4,130,766 | 12/1978 | Patel et al. | 307/221 D |
| 5,291,083 | * 3/1994 | Blalock et al. | 327/284 |
| 5,517,543 | 5/1996 | Schleupen et al. | 377/79 |

OTHER PUBLICATIONS

Meiksin, Z.H., Thackray, P.C. "Electronic Design With Off–The–Shelf Integrated Circuits" 2nd Ed., pp. 336–337.
Millman, J., Halkias, C.C., "Integrated Electronics: Analog and Digital Circuits and Systems", pp. 630–631.
Comer, D.J., "Modern Electronic circuit Design", pp. 416–419.
Hughes, F.W., "Illustrated Guidebook to Electronic Devices and Circuits", pp. 348–351.
Lenk, J.D., "Digital Integrated Circuits", pp. 332–335.

\* cited by examiner

*Primary Examiner*—Toan Tran
*Assistant Examiner*—Cassandra Cox
(74) *Attorney, Agent, or Firm*—David R. Yohannan; Collier Shannon Scott, PLLC (57) ABSTRACT

Circuits for sequentially addressing memory locations in time with pulses received from a clock are disclosed. The circuits may provide a positive voltage output signal at successive output nodes associated with corresponding stages in the circuit responsive to the application of a clock signal to the circuit stages. The circuit may comprise at least first and second stages wherein said first stage comprises means for providing a positive voltage signal at a first output node in the first stage in response to application of a first positive clock pulse to the first stage, and wherein said second stage comprises means for providing a positive voltage signal at a second output node in the second stage in response to application of a second positive clock pulse to the second stage. Addressing of memory locations that contain pixel information for a video display is one particular application in which sequential addressing may be required. Sequential addressing is useful in video applications because it permits sequential selection of the pixel rows and columns that make up the display screen. Sequential scanning of the memory locations for screen information can be carried out in conjunction with the scanning of an electron source across the screen of the display.

21 Claims, 11 Drawing Sheets

METHOD AND APPARATUS FOR SEQUENTIAL MEMORY ADDRESSING

CROSS REFERENCE TO RELATED PATENT APPLICATION

This application relates to and claims priority on provisional application Ser. No. 60/084,495 filed May 6, 1998.

FIELD OF THE INVENTION

The invention relates to digital circuits for sequentially shifting a "1" output through each bit of a multi-bit character in response to clock pulses.

BACKGROUND OF THE INVENTION

The present invention may be employed in any electronic system in which there is a need for sequential addressing of memory locations in time with pulses received from a clock. The technique of serial addressing a memory array is very widely used in a wide variety of electronic products. Serial addressing is commonly achieved using binary counters, shift registers, ring counters etc., whose basic building blocks are D-latches, J-K master-slave flip-flops, and similar circuits. Many electronic circuit text books, as well as integrated circuit manufacturers' technical literature, provide specifications and technical details of the various methods of building such circuits.

Five text books are noted, in particular, that explain known "counting" circuits which may be used for sequential addressing. The five above-referenced text books are: (1) Meiksin, Z. H., Thackray, P.C. Electronic Design With Off-The-Shelf Integrated Circuits, 2nd Ed., pp.336–337; (2) Millman, J., Halkias, C. C., Integrated Electronics: Analog and Digital Circuits and Systems, pp. 630–631; (3) Comer, D. J., modern Electronic Circuit Design, pp. 416–419; (4) Hughes, F. W., Illustrated Guidebook to Electronic Devices and Circuits, pp. 348–351; and (5) Lenk, J. D., Digital Integrated Circuits, pp. 332–335, each of which is hereby incorporated herein by reference.

Addressing of memory locations that contain pixel information for a video display is one particular application in which sequential addressing may be required. Sequential addressing is useful in video applications because it permits sequential selection of the pixel rows and columns that make up the display screen. Sequential scanning of the memory locations for screen information can be carried out in conjunction with the scanning of an electron source across the screen of the display.

Heretofore, sequential addressing of memory locations containing pixel information has been achieved using a series of standard J-K master-slave or other flip-flop devices. While such devices do enable the required sequential addressing to be carried out, they do so at the expense of considerable density and power consumption penalties.

Figure 1:
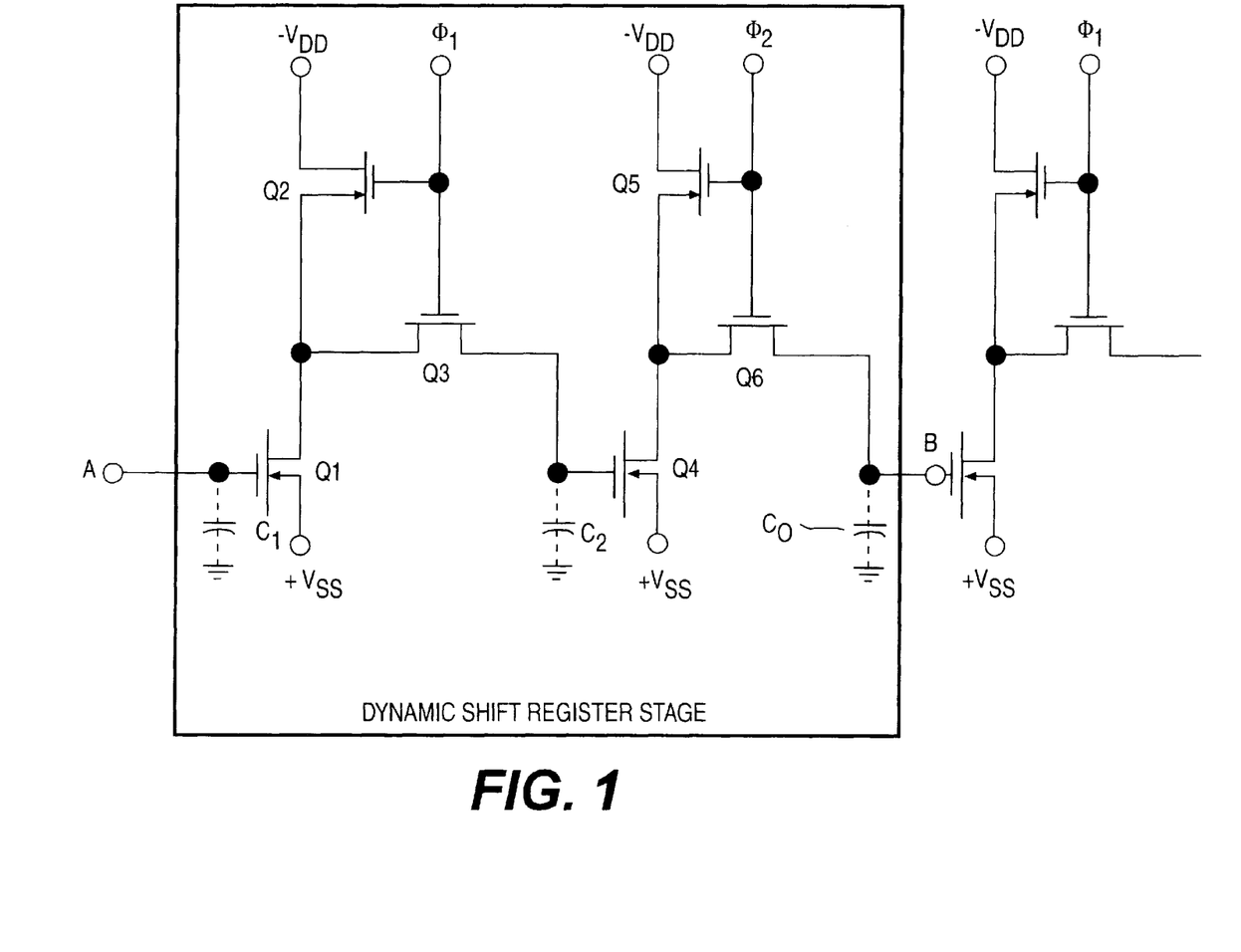
FIG. 1 is a schematic of a known counting circuit.

For example, FIG. 1 shows a known dynamic shift register which may be used for sequential addressing applications. The shift register does not use the J-K master-slave flip-flop, which is the popular work horse of the industry for this type of application. Because the shift register does not use J-K flip-flops, it uses fewer devices per stage as compared with several other circuits described in the text books listed above. Even though the shift register does not use J-K flip-flops, it still uses six active devices (plus two parasitic capacitors) per stage. Furthermore, in order to use the shift register as a walking '1' circuit (for sequential addressing of a video memory), its input has to be loaded with a leading "1" followed by a continuous string of zeros. The alternative is to use a standard J-K Master Slave flip-flop or some other (e.g., D-type) flip-flop to build a shift register/binary counter. Each, however, requires a large number of active devices per stage and consumes much more power. The density is also poor because of the high device count per stage.

Examples of the prior art are provided by the following U.S. Patents, U.S. Pat. No. 3,579,273, Dynamic Shift Register (Harold D. Cook) discloses a general purpose dynamic shift register wherein the input data can be a series of digital "1"s and "0"s in any random sequence; the sequence being repeated at the successive stages of the register with precise time lags. It can be used as a walking "1" circuit if the first input is a "1" and the subsequent inputs are "0". However, it does not provide bidirectionality and does not include means for resetting all the stages to "0" to initiate a new cycle. The two embodiments shown in the '273 patent use four and three transistors per stage plus storage capacitors. An extra transistor would be required per stage to include the reset feature.

U.S. Pat. No. 3,643,106, Analog Shift Register (Berwin et al.) discloses an analog/digital shift register using two transistors and two capacitors per stage. In addition to the input data pulse, it needs four more input clock pulses, identified as K1, K2, G1 and G2 and a couple of "batteries" B1 and B2 in the preferred embodiment (FIG. 1). Embodiments of the invention do not need the input data pulse and use only two clock pulses.

U.S. Pat. No. 3,676,711, Delay Line Using Integrated MOS Circuitry (Ahrons) discloses a "bucket brigade" type of delay line. The delay line circuit can also be used as a shift register or a walking "1" circuit. This circuit, however, requires six transistors and a capacitor per half-stage and is therefore far more complex and expensive as compared with the circuit of the invention.

U.S. Pat. No. 3,708,690, Shift Register (Paivinen) discloses a multi-phase shift register using only "half" circuit per stage, as opposed to a pair of "half" circuits used in a conventional shift register. This is made possible by using an additional "half" circuit per column which is "empty" and is linked up dynamically with successive stages to serve momentarily as the missing second "half" of the stage. However, each "half" circuit still uses three transistors and a storage capacitor; and each stage of the shift register requires a corresponding dedicated stage in an accompanying ring counter plus several peripheral circuits. The circuit is far more complex than the circuit disclosed in the present invention.

U.S. Pat. No. 3,789,239, Signal Boost for Shift Register (Heeren) discloses a type of shift register used to "increase slightly the voltages at the capacitor nodes in order to enhance the operation of the shift register". The walking "1" circuit of the invention does not require this type of enhancement and, therefore, distinguishes from the '239 patent.

The sequential addressing circuit of the present invention provides significant improvement in the density and power of the circuit as compared with the above-referenced circuits. In light of the industry wide desire of minimizing display bulk, weight, and power consumption, there is a need to improve upon the previously used sequential addressing circuits.

The circuit of the invention uses fewer active devices per stage and consumes less power as compared with known counting circuits. Also, the circuit of the invention is sufficiently compact that it improves the packing density of the array in most applications.

OBJECTS OF THE INVENTION

It is an object of the present invention to provide a circuit for sequential memory addressing having high packing density.

It is another object of the present invention to provide a circuit for sequential memory addressing having low power needs.

It is another object of the present invention to provide a circuit for sequential memory addressing having high speed operation.

It is another object of the present invention to provide a circuit for sequential memory addressing having a walking '1' circuit used for sequential addressing of a large memory.

It is another object of the present invention to provide a circuit for sequential memory addressing having capability for driving pixels in a display panel.

SUMMARY OF THE INVENTION

In response to this challenge, Applicants have developed an innovative circuit wherein said first stage comprises means for providing a positive voltage signal at a first output node in the first stage in response to application of a first positive clock pulse to the first stage, and wherein said second stage comprises means for providing a positive voltage signal at a second output node in the second stage in response to application of a second positive clock pulse to the second stage.

DETAILED DESCRIPTION OF THE PREFERRED EMBODIMENT

Figure 2:
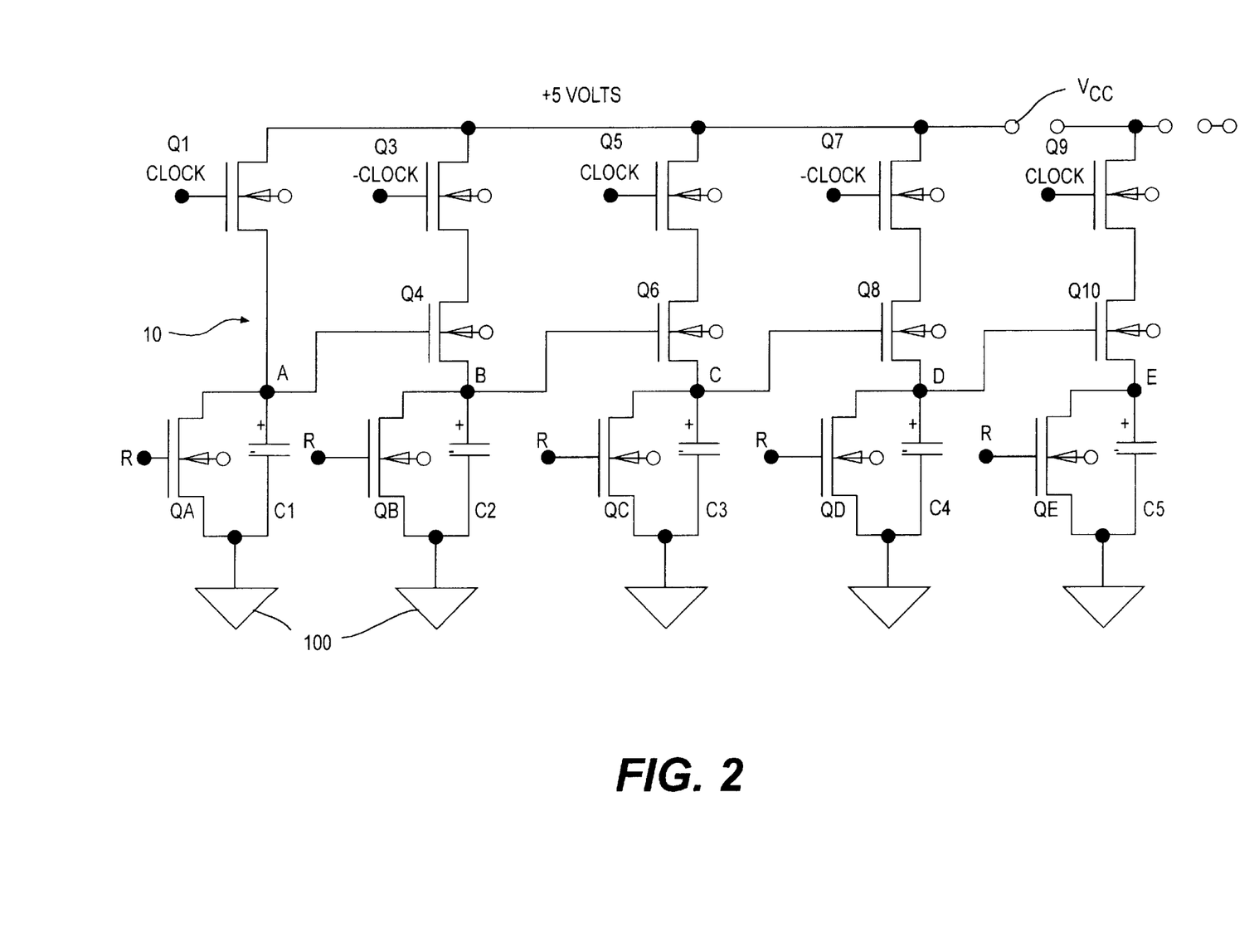
FIG. 2 is a schematic of a circuit corresponding to a first embodiment of the invention.

A first embodiment of the invention is shown schematically in FIG. 2. The circuit shown in FIG. 2 is based on the principle of "bucket brigade" charge transfer from capacitor to capacitor. With reference to FIG. 2, a logical circuit 10 for sequentially providing a positive (i.e. logic '1') output signal at successive output nodes (i.e. nodes A, B, C, etc.) is shown. Each of the output nodes is associated with corresponding stages (e.g. first, second, third, etc.)in the circuit 10 responsive to the application of a pair of complementary input clock pulses to the circuit stages. The pair of complementary input clock pulses are referred to as CLOCK and -CLOCK, and are applied alternately to the gates of transistors Q1, Q3, Q5, etc. The CLOCK pulse may comprise a positive voltage clock pulse (e.g. 0 to +5 Volts), and the -CLOCK pulse may comprise a compliment (e.g. approximately +5 to 0 Volts).

The circuit 10 includes at least first and second stages, and may include many more stages that are configured like the first and second stages. In the embodiment shown in FIG. 2, the first stage comprises a first transistor Q1 having a gate connected to a first clock pulse terminal (labeled CLOCK), a drain connected to a positive (+5 Volts) terminal Vcc of a dc power supply, and a source connected to a first output node A. The negative terminal 100 of the dc power supply is grounded. A second transistor QA, which is included in the first stage of the circuit, has a gate connected to an external reset terminal R, a drain connected to the first output node A, and a grounded source. The first stage is completed by a first capacitor C1, which is connected to the first output node A and to ground in parallel with the second transistor QA.

The second stage elf the circuit comprises a third transistor Q3 having a gate connected to a complementary input clock pulse terminal (labeled -CLOCK), a drain connected to the positive terminal Vcc, and a source connected to the drain of a fourth transistor Q4. In turn, the fourth transistor Q4 includes a gate connected to the first output node A, and a source connected to a second output node B. The second stage further includes a fifth transistor QB and a second capacitor C2. The fifth transistor QB has a gate connected to the external input terminal R, a drain connected to the second output node B, and a grounded source. The second capacitor C2 is connected to the second output node B and to ground in parallel with the fifth transistor QB.

The circuit 10 may be constructed with numerous additional stages, as shown in FIG. 2. Each additional stage (e.g. the third, fourth, and fifth stages shown) may include a corresponding output node (C, D, and E). The invention is not limited by the number of stages that may be included in the circuit 10. It is contemplated that the circuit 10 may include a stage for each line, column, and/or pixel of a display, which may translate into a circuit with hundreds, or even thousands of such stages.

The components in each of the stages may vary in different embodiments of the invention. In the preferred embodiment shown in FIG. 2, each of the transistors shown may comprise N-type insulated gate field effect transistors (N-FETs). Further, each of the capacitors shown may comprise adjacent layers of metal to metal, doped polysilicon to metal, doped polysilicon diffusion, N+ diffusion to P+ diffusion, etc.

The circuit 10 shown in FIG. 2 sequentially provides a logical "1" output at each node in the circuit in response to the application of sequential clock pulses to the circuit. With the arrival of each new clock pulse (Pulse 1, Pulse 2, etc.), the capacitors C1, C2, C3, etc., are charged up in turn with the arrival of the new clock pulse. When all of the capacitors are charged, the cycle is complete and the next cycle may be initiated by discharging the capacitors with a reset pulse to terminal R. The circuit 10 provides a compact and energy efficient counting circuit because it may only require three active devices (transistors) and one storage capacitor per stage.

The circuit 10 may be initialized by applying a brief reset pulse (about the voltage of Vcc) to external reset terminals R to turn on all of transistors QA, QB, QC, etc., so that the capacitors C1, C2, C3, etc., are discharged. Application of the reset pulse to input terminals R resets the voltages at the nodes A, B, C, etc. to zero by providing a short circuit across the each of the capacitors C1, C2, C3, etc. to discharge them. The reset of the voltage at the output nodes also acts to turn off the transistors Q4, Q6, etc., that have gates connected to the output nodes. Once the capacitors are reset to zero, the voltage applied to the reset terminals may be returned to low so that the short circuit across the capacitors is removed. The capacitors are now ready to be subsequently charged up in turn to provide positive voltages at the output nodes.

After the circuit 10 is initialized, an incoming positive clock pulse (+5 V) is applied to the transistors that have a gate connected to a CLOCK terminal and a drain connected to the positive terminal Vcc, e.g. transistors Q1, Q5, Q9, etc. At the same time, the complementary low clock pulse (0 V) is applied to the intervening transistors Q3, Q7, etc., that have a -CLOCK terminal. Each of the transistors Q1, Q3, etc. that are connected to the positive terminal Vcc are adapted to turn on and off as their respective gate voltages toggle between 0 Volts (ground) and +5 Volts (Vcc) responsive to the application of input clock pulses to the transistors. The transistors with a gate connected to a CLOCK terminal receive a positive voltage clock pulse when the transistors with a gate connected to a -CLOCK terminal receive a low voltage pulse. Conversely, the transistors connected to CLOCK terminals receive a low voltage pulse when the transistors connected to -CLOCK terminals receive a positive voltage pulse. In this manner the transistors Q3 and Q7 are switched off at approximately the same time the transistors Q1, Q5, and Q9 are switched on. During the next clock pulse, the transistors Q3 and Q7 are switched on while the transistors Q1, Q5, and Q9 are switched off.

With continued reference to FIG. 2, the application of the first clock pulse to the first transistor Q1 causes Q1 to turn on, and accordingly, allows the first capacitor C1 to charge up. As the first capacitor C1 charges, the voltage at node A goes from 0 Volts to +5 Volts, thereby indicating a digital "1" at node A. In each of the stages of the circuit 10, the "1" signal generated by the stage is physically embodied by a positive voltage at the output node in the stage, while a "0" signal is embodied by a less positive or preferably zero voltage.

While the first capacitor C1 is charging, the second capacitor C2 cannot charge up because the third transistor Q3 is turned off. Therefore, the voltage at the node B remains low or zero. Similarly, the third capacitor C3 cannot charge up because the transistor Q6 is turned off, the fourth capacitor C4 cannot charge up because the transistors Q7 and Q8 are turned off, and the fifth capacitor C5 cannot charge up because the transistor Q10 is turned off. To sum up, only C1 may charge up with the arrival of the first clock pulse, and accordingly only the voltage at the first output node A is positive. The voltage at all the other output nodes B, C, etc., remains zero.

Upon the next clock pulse (Pulse 2) an incoming positive clock pulse (+5 V) is applied to the transistor Q3, Q7, etc., that have a -CLOCK terminal. At the same time, the complementary low clock pulse (0 V) is applied to the intervening transistors Q1, Q5, Q9, etc., that have a CLOCK terminal. In this manner the transistors Q1, Q5, and Q9 are switched off, and at the same time the transistors Q3, Q7, etc. are switched on.

While Pulse 2 turns transistor Q1 off, it does not affect the charge on capacitor C1, which remains intact. The charge on capacitor C1 causes transistor Q4 to turn on, so that both transistors Q4 and Q3 are turned on during Pulse 2. Since both Q3 and Q4 are on, the capacitor C2 is charged up.

The third capacitor C3 cannot charge up because the transistor Q5 is turned off, the fourth capacitor C4 cannot charge up because the transistor Q8 is turned off, and the fifth capacitor C5 cannot charge up because the transistor Q9 is turned off. As a result of Pulse 2, only capacitor C2 may newly charge up, and accordingly only the voltage at the first and second output nodes A and B is positive after Pulse 2. This pattern may be repeated with Pulse 3, 4, 5, etc. to successively produce a positive voltage at output nodes C, D, E, etc.

Figure 3:
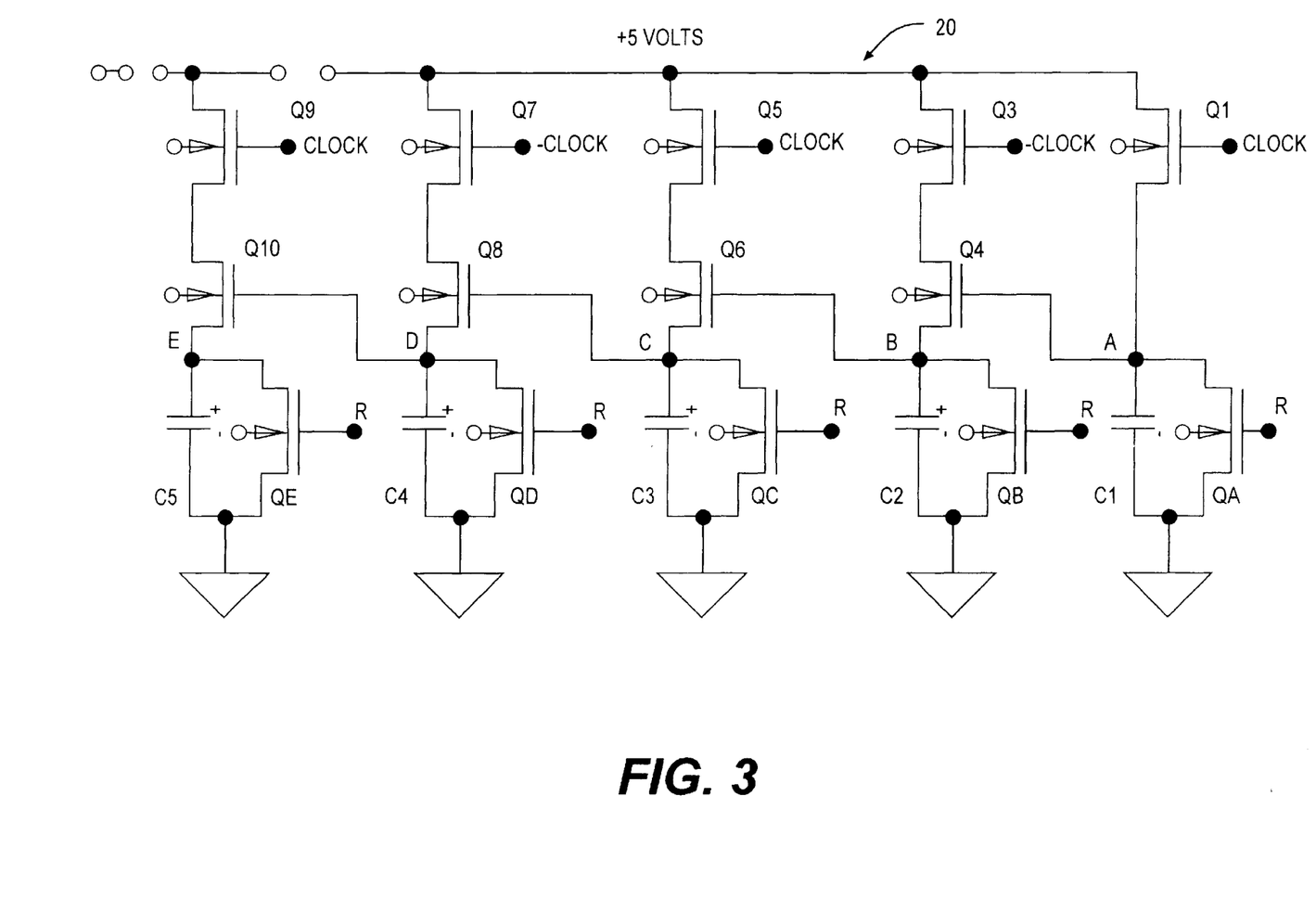
FIG. 3 is a schematic of a circuit corresponding to a second embodiment of the invention.

With reference to FIG. 3, the circuit 10 shown in FIG. 2 may be modified in a second embodiment of the invention to form a circuit 20. Circuit 20 enables the progression of positive voltages through the output nodes A, B, C, etc. from right to left through the circuit as shown. The circuit 20 demonstrates that the invention may incorporate complementary circuits 10 and 20 for progressing a digital "1" output back and forth over a video row or column of pixels.

Figure 4:
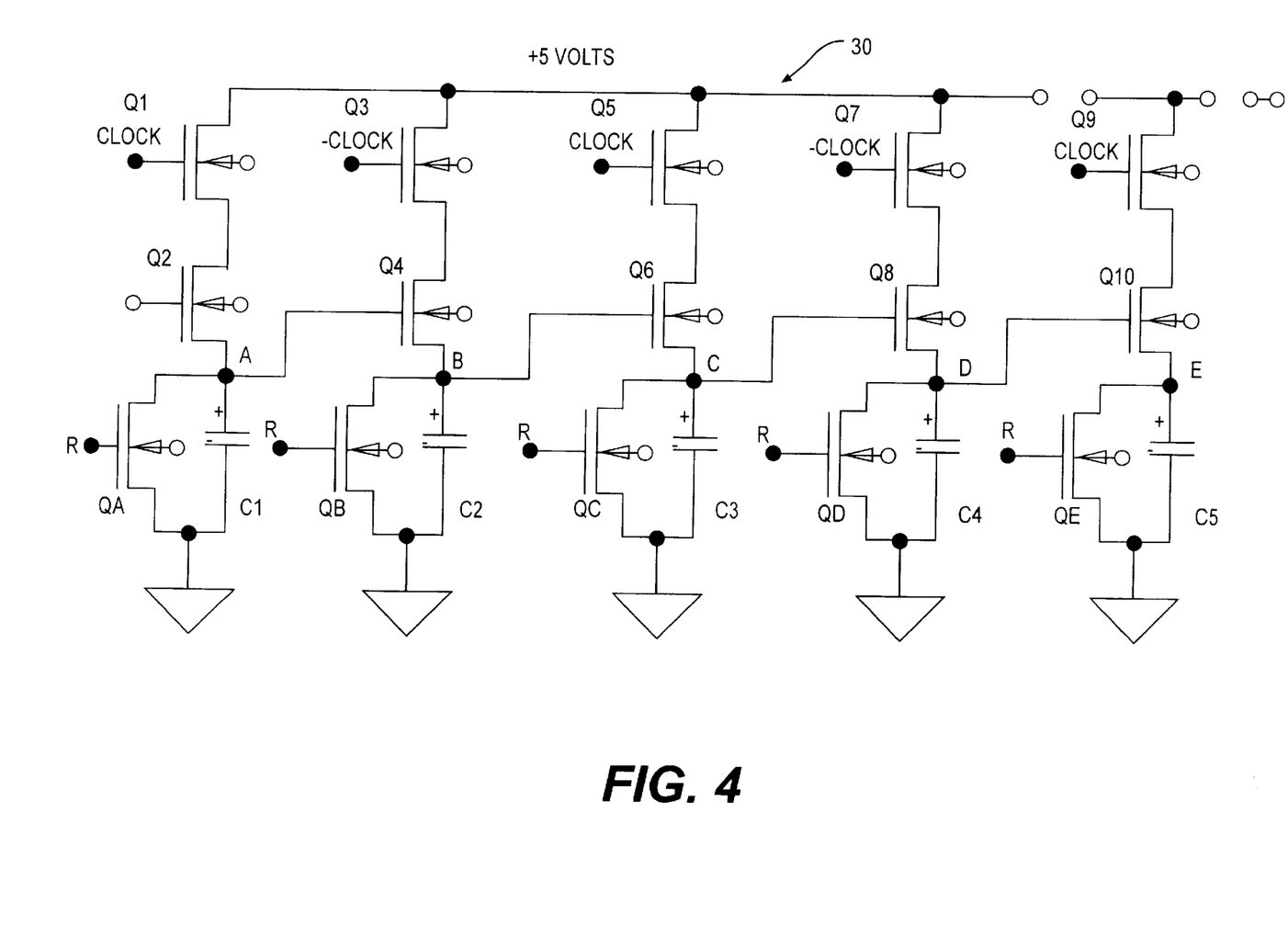
FIG. 4 is a schematic of a circuit corresponding to a third embodiment of the invention.

A third embodiment of the invention is illustrated by the circuit 30 shown in FIG. 4, which is a modification of the circuit 10 shown in FIG. 2. As compared with circuit 10, the circuit 30 includes an additional transistor Q2 in the first stage of the circuit. The addition of the transistor Q2 to the first stage makes all of the stages in the circuit 30 identical in terms of number of transistors used. The transistor Q2 may be used to initiate start of the process of turning on the output nodes A, B, C, etc. The circuit 30 remains unresponsive to the application of any clock pulses until the transistor Q2 is turned on to connect the output node A to the source of transistor Q1.

Figure 5:
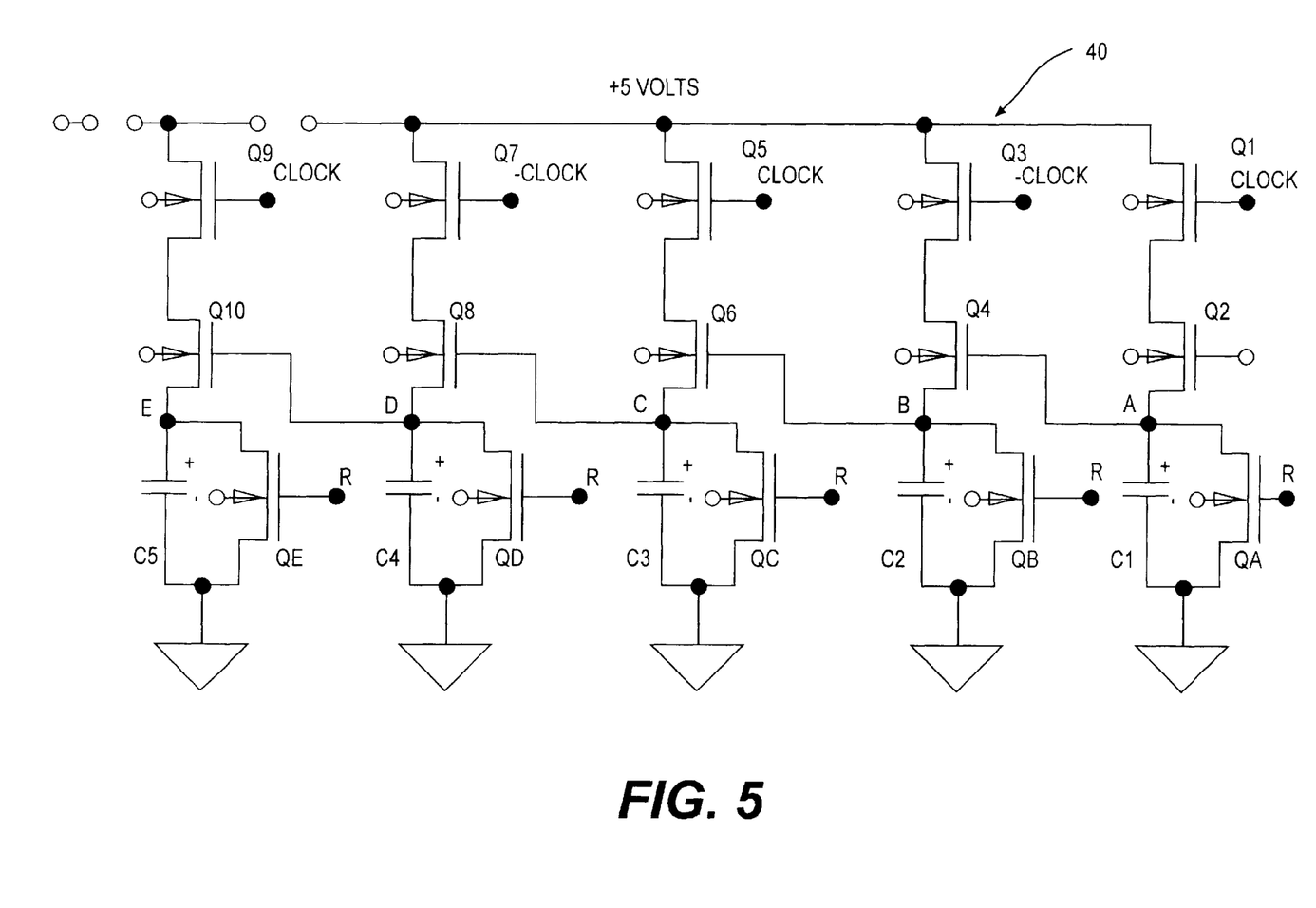
FIG. 5 is a schematic of a circuit corresponding to a fourth embodiment of the invention.

The circuit 30 shown in FIG. 4 may be modified in a fourth embodiment of the invention to form the circuit 40 shown in FIG. 5. The circuit 40 differs from the circuit 30 in that the former provides for the progression of positive voltages through the output nodes A, B, C, etc. from right to left. In other words, the circuit 40 remains unresponsive to any clock pulses until the transistor Q2 is turned on to connect the output node A to the source of transistor Q1. Thus, circuit 40 is the complement of circuit 30.

Figure 6:
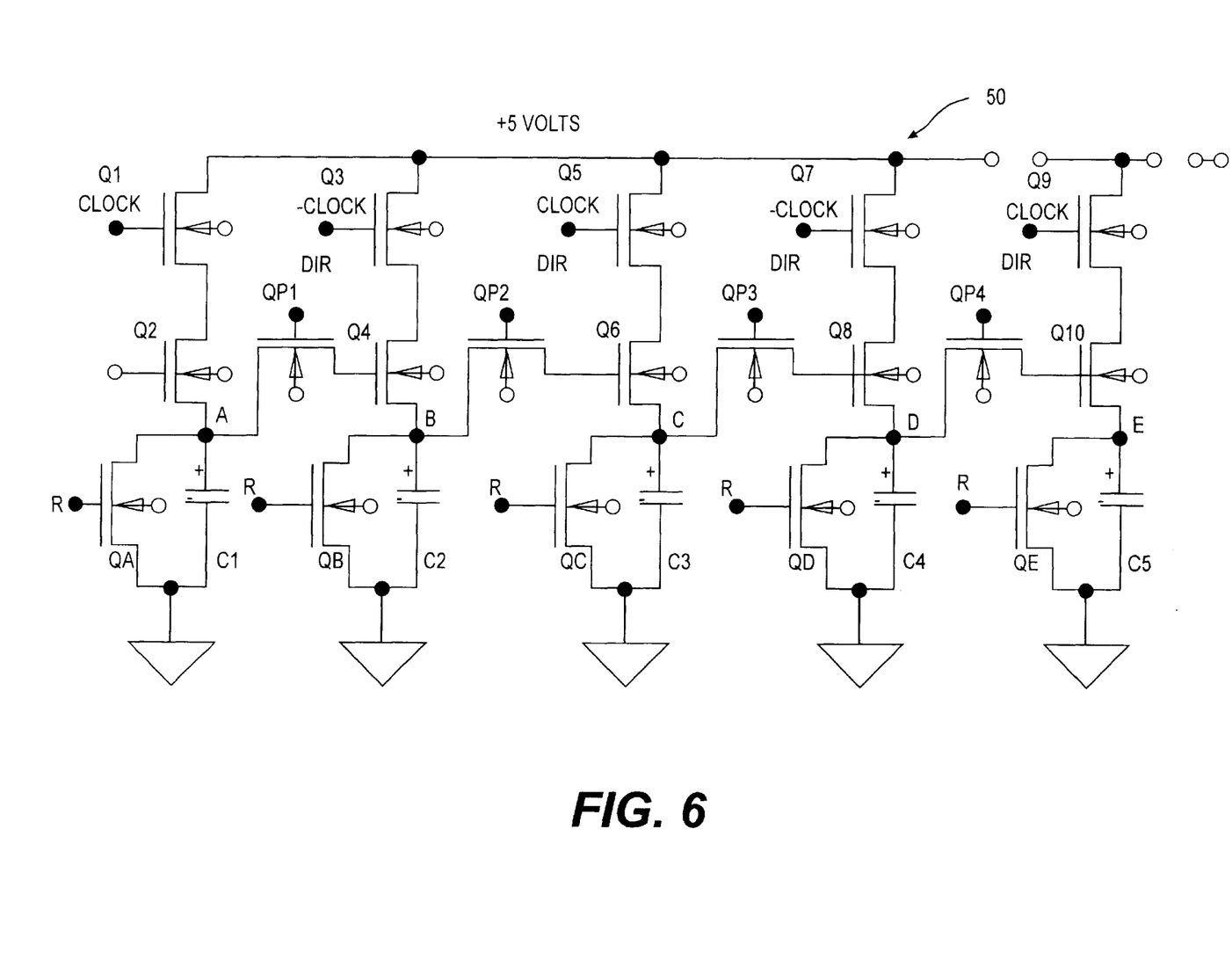
FIG. 6 is a schematic of a circuit corresponding to a fifth embodiment of the invention.

With reference to FIG. 6, the circuit 30 shown in FIG. 4 may be modified in a fifth embodiment of the invention to form the circuit 50. Circuit 50 differs from circuit 30 in that an additional transistor has been provided in the electrical connection between the output node of each stage and a transistor of the next stage. For example, circuit 50 includes an additional transistor QF1 in the electrical connection between output node A and the transistor Q4. Transistor QF1 is provided such that the gate is tied to an external terminal DIR, the drain is connected to node A, and the source is connected to the gate of transistor Q4. Additional transistors QF2, QF3, etc. are provided between each of the stages of the circuit 50 in a like manner. Application of a positive voltage to the DIR terminals turns the family of QF transistors on. Control over the application of a positive voltage to the DIR terminals thus permits selective control over propagation of a digital "1" through the circuit. For example, in circuit 50 a positive voltage cannot be produced at output node B, even if there is a positive voltage at output node A, unless transistor QF1 is turned on. In effect, turning on each of the QF transistors shown in circuit 50 of FIG. 6 converts circuit 50 into an equivalent of circuit 30.

Figure 7:
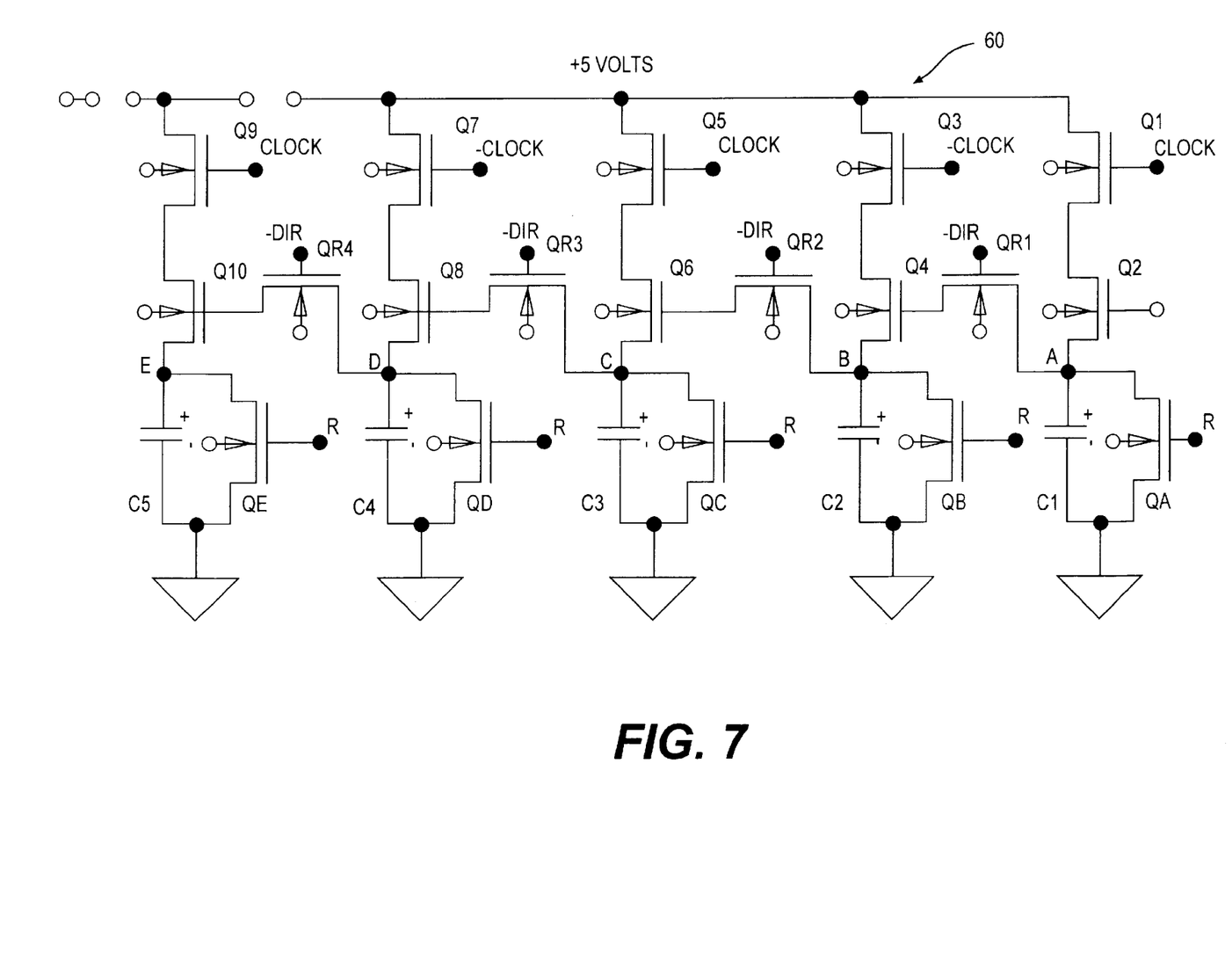
FIG. 7 is a schematic of a circuit corresponding to a sixth embodiment of the invention.

With reference to FIG. 7, the circuit 50 shown in FIG. 6 may be modified in a sixth embodiment of the invention to form the circuit 60 shown in FIG. 7. The circuit 60 differs from the circuit 50 in that the former provides for the progression of positive voltages through the output nodes A, B, C, etc. from right to left. Additional transistors QR1, QR2, etc. are provided between each of the stages of the circuit 60. Each of the QR transistors shown in circuit 60 is provided with a gate tied to a second type of external terminal -DIR. Application of a positive voltage to the -DIR terminals turns the family of QR transistors on and renders circuit 60 the equivalent of circuit 40 shown in FIG. 5.

Figure 8:
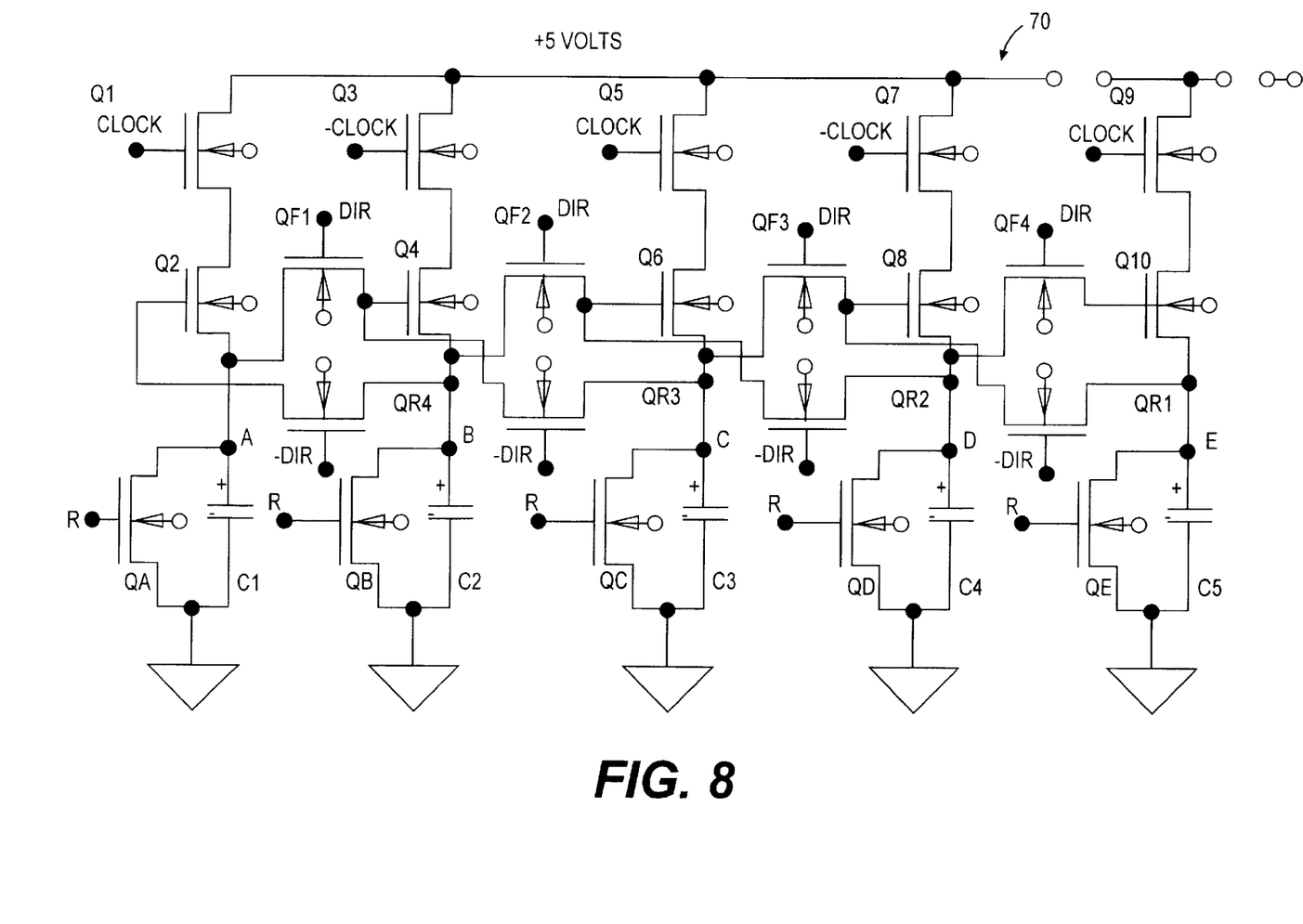
FIG. 8 is a schematic of a circuit corresponding to a seventh embodiment of the invention.

A seventh embodiment of the invention is illustrated by circuit 70 shown in FIG. 8. Circuit 70 may be produced by merging circuits 50 and 60 shown in FIGS. 6 and 7, respectively, into a single circuit. The circuit 70 is provided with both a family of QF transistors and a family of QR transistors linking the output node of each stage with the gate of a transistor in both the preceding and following stages. The QF and QR transistors are preferably controlled with complementary voltage signals (high and low) that are applied to the complementary external terminals DIR and -DIR, respectively.

Operationally, the circuit 70 shown in FIG. 8 may propagate a digital "1" from left to right when the external input to the DIR terminals is up (i.e. positive) and the external input to the -DIR terminals is low (zero). Propagation of the digital "1" may be reversed, from right to left, when the external input to the -DIR terminals is high (positive) and the external input to the DIR terminals is low (zero). The circuit 70 thus allows selective control of the direction of propagation of the "1" at the output nodes using selective application of a positive voltage to the DIR and -DIR terminals.

Figure 9:
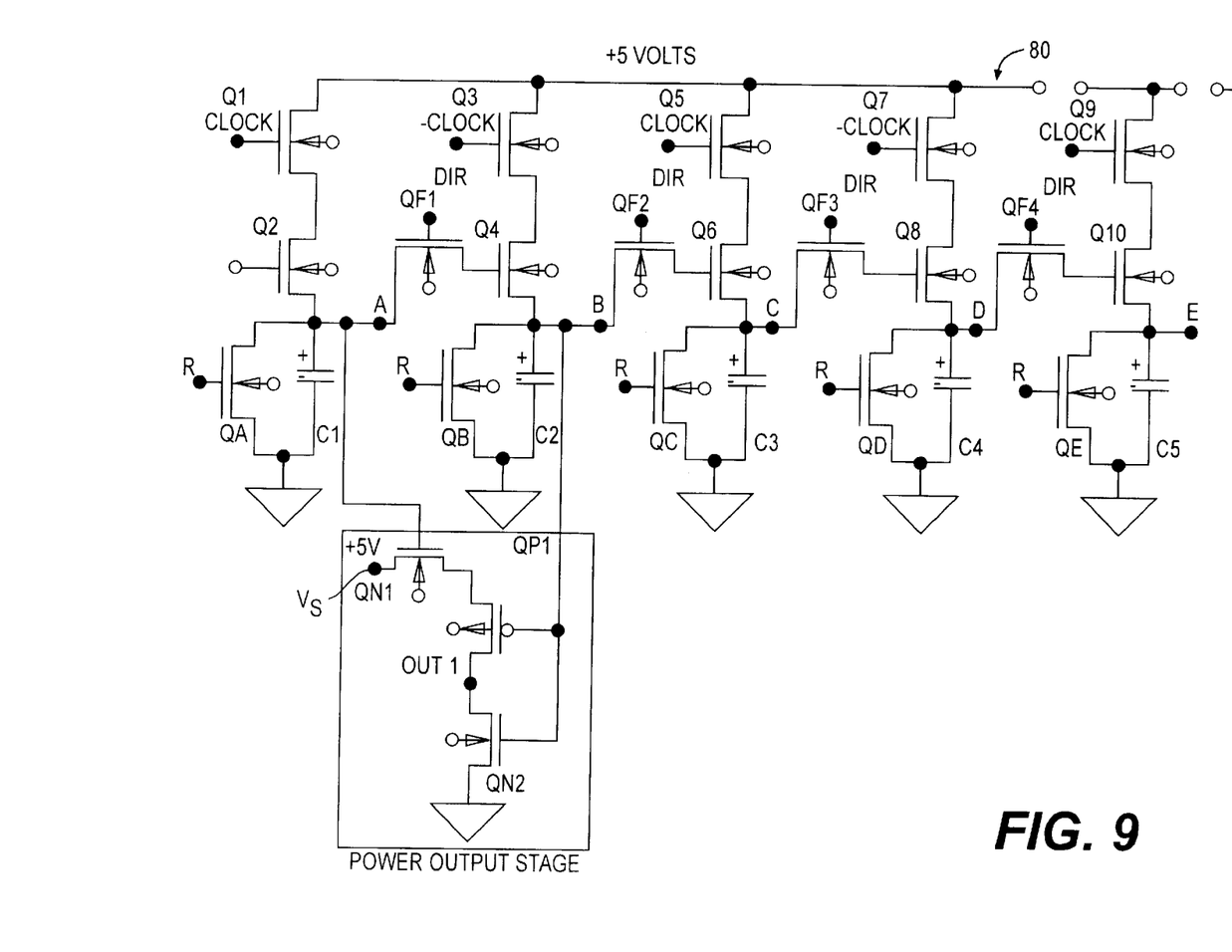
FIG. 9 is a schematic of a circuit corresponding to an eighth embodiment of the invention.

In an eighth embodiment of the invention, shown in FIG. 9, the circuit 70 may be modified to form a circuit 80 that includes one or more additional sub-circuits labeled POWER OUTPUT STAGE. Each POWER OUTPUT STAGE is connected to two successive output nodes A and B, or B and C, etc. to provide an output voltage from the circuit 80 to an external component (not shown) in response to the occurrence of a positive voltage at an output node in the circuit.

One POWER OUTPUT STAGE is shown in FIG. 9 as for ease of illustration. An operationally complete circuit 80 preferably includes (n−1) POWER OUTPUT STAGES for a circuit with (n) stages. For example, circuit 80 is depicted as a four stage circuit, and accordingly the preferred embodiment of circuit 80 would also include four POWER OUTPUT STAGES.

The POWER OUTPUT STAGE of circuit 80 includes an N-type transistor QN1 having a drain connected to the positive terminal of a power supply Vs, a gate to the output node A, and a source connected to the drain of a P-type transistor QP1. Transistor QP1 has a gate tied to the next output node B, and a source connected to the drain of a second N-type transistor QN2. The gate of transistor QN2 is tied to the gate of transistor QP1 and the source is grounded. The transistors QP1 and QN2 constitute a conventional power output driver stage in each POWER OUTPUT STAGE. The transistor QN1 acts to enable or disable the output driver.

The POWER OUTPUT STAGE shown in FIG. 9 operates as follows; initially, when both output nodes A and B are low, the POWER OUTPUT STAGE is disabled and the power output terminal OUT1 is in the high impedance mode. Next, when node A goes high and node B is still low, the terminal OUT1 goes high. With the application of the next clock pulse node B goes high, which causes transistor QP1 to turn off and transistor QN2 to turn on. Consequently terminal OUT1 goes low because it is shunted to ground through transistor QN2. Terminal OUT1 remains low with subsequent clock pulses, which produce positive voltages at successive nodes C, D, etc., but do not affect the status of transistors QP1 or QN1. Pursuant to the foregoing operation, the POWER OUTPUT STAGE only powers up the output terminal OUT1 in response to the first clock pulse to produce a positive voltage at output node A, and terminal OUT1 returns to a low state with the very next clock pulse.

By including a POWER OUTPUT STAGE sub-circuit for each pair of output nodes it is evident that the circuit 80 may provide a walking digital "1" at the output terminals OUT1, OUT2, OUT3, etc., at successive POWER OUTPUT STAGES (not shown). With each subsequent clock pulse a positive voltage will be relayed from one output terminal to the next. In effect, a digital "1" output walks through the sequence of output terminals in the successive POWER OUTPUT STAGES. In this manner the circuit 80 may be used to sequentially drive a row or column in a memory array, display panel, or other circuit, using row and column select techniques.

Figure 10:
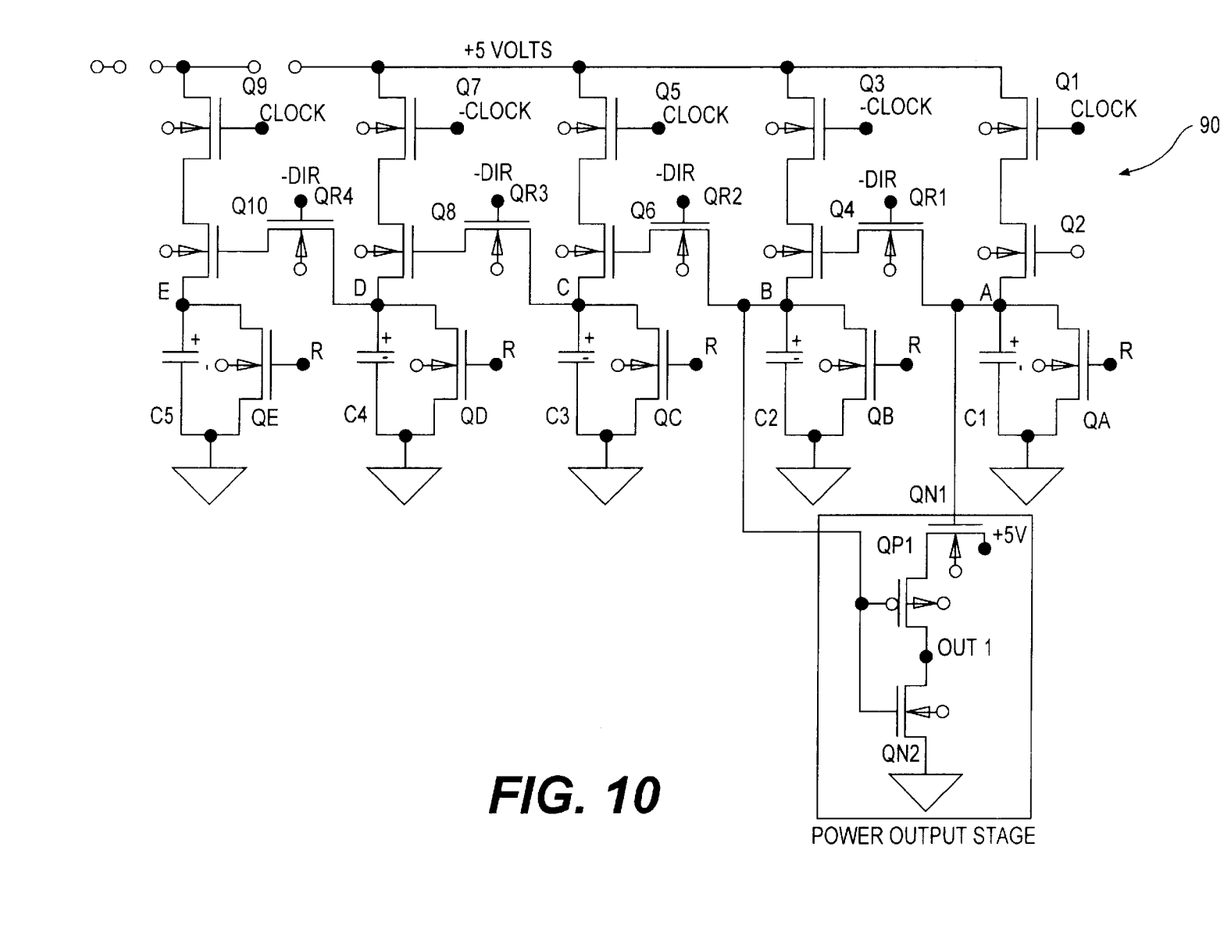
FIG. 10 is a schematic of a circuit corresponding to a ninth embodiment of the invention.

With reference to FIG. 10, in a ninth embodiment of the invention, a circuit 90 is shown which is the complement of the circuit 80 shown in FIG. 9. In circuit 90 the voltage at the output nodes A, B, C, etc. goes high sequentially, starting with the right most stage. Thus the direction of the walking digital "1" output is reversed from that shown in FIG. 9 to proceed from right to left.

Figure 11:
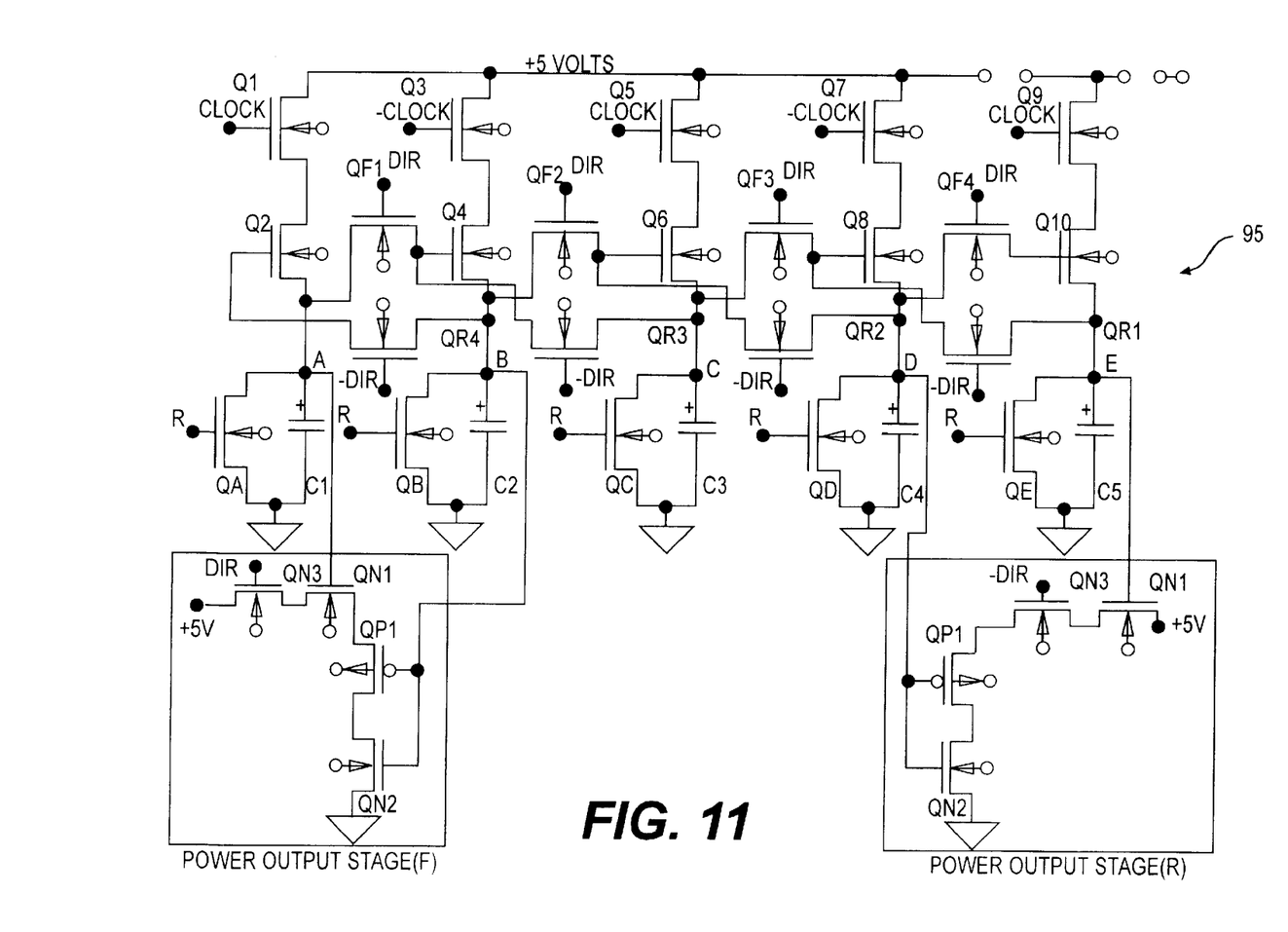
FIG. 11 is a schematic of a circuit corresponding to a tenth embodiment of the invention.

A circuit 95, which comprises a tenth embodiment of the invention, is shown in FIG. 11. Circuit 95 may be produced by merging the circuits 80 and 90 shown in FIGS. 9 and 10, respectively. Circuit 95 enables selective reversal of the direction of the walking digital "1" output the output may be selected to propagate from left to right or right to left, i.e. by making the external input DIR high or low, respectively. The forward (left to right) propagating output stage is labeled POWER OUTPUT STAGE(F) and the reverse (right to left) propagating output stage is labeled POWER OUTPUT STAGE(R).

We claim:

1. A circuit for sequentially providing a positive voltage output signal at successive output nodes associated with corresponding stages in the circuit responsive to the application of a clock signal to the circuit stages, said circuit comprising at least first and second stages, wherein said first stage comprises:

a first transistor having a gate connected to a first clock pulse terminal, a drain connected to a positive voltage terminal, and a source connected to a first output node;

a second transistor having a drain connected to the first output node, a gate connected to an external reset terminal, and a source connected to ground; and a first capacitor connected to the first output node and to ground in parallel with said second transistor, and wherein said second stage comprises:

a third transistor having a gate connected to a complement of the clock signal input line, a drain connected to the positive voltage terminal, and a source connected to the drain of a fourth transistor;

a fourth transistor having a gate connected to the first output node, a source connected to a second output node, and a drain connected to the source of the third transistor;

a fifth transistor having a gate connected to the reset terminal, a drain connected to the second output node, and a grounded source; and a second capacitor connected to the second output node and to ground in parallel with said fifth transistor.

2. A circuit for sequentially providing a positive voltage output signal at successive output nodes associated with corresponding stages in the circuit responsive to the application of a clock signal to the circuit stages, said circuit comprising at least first and second stages,     wherein said first stage consists of two transistors and a capacitor for providing a positive voltage signal at a first output node in the first stage in response to application of a first positive clock pulse to the first stage; and     wherein said second stage comprises means for providing a positive voltage signal at a second output node in the second stage in response to application of a second positive clock pulse to the second stage.

3. The circuit of claim 2 wherein said second stage consists of three transistors and a capacitor.

4. The circuit of claim 2 wherein each stage of the circuit consists of three transistors, with the exception of the first stage.

5. The circuit of claim 2 wherein said first and second stages each include an N-type insulated gate field effect transistor.

6. The circuit of claim 2 wherein each stage of the circuit other than the first stage comprises at least three transistors.

7. The circuit of claim 6 wherein said circuit further comprises:

a power output sub-circuit connected to said first output node and said second output node, wherein said sub-circuit comprises:
    a first transistor;
    a second transistor;
    a third transistor; and
    a terminal for connection to a power supply; wherein said first, second and third transistors, and said power supply terminal arm operatively connected.

8. The sub-circuit of claim 7 wherein said first transistor has a drain connected to the positive terminal of said power supply, a gate tied to said first output node, and a source connected to the drain of said second transistor, and wherein said second transistor has a gate tied to said second output node and a source connected to the drain of said third transistor, and wherein said third transistor has a gate tied to the gate of said second transistor.

9. The circuit of claim 7 wherein said circuit further comprises plural sub-circuits.

10. A method of sequentially providing a positive voltage output signal at successive output nodes associated with at least first and second stages in a circuit, which comprises:

providing a positive voltage signal at a first output node in the first stage in response to application of a first positive clock pulse to the first stage; and     providing a positive voltage signal at a second output node in the second stage in response to application of a second positive clock pulse to the second stage,     wherein said first stage consists of two transistors and a capacitor.

11. A method of sequentially providing a positive voltage output signal as recited in claim 10, wherein said second stage consists of three transistors and a capacitor.

12. A method of sequentially providing a positive voltage output signal as recited in claim 10, wherein each stage of said circuit consists of three transistors, with the exception of said first stage.

13. A method of sequentially providing a positive voltage output signal as recited in claim 10, wherein said first and second stages each include an N-type insulated gate field effect transistor.

14. A circuit for sequentially providing positive voltage output signals at successive output nodes progressing from a first side of the circuit to a second side of the circuit, said output signals each being associated with a corresponding circuit stage and being generated in response to the application of two clock signals to the circuit stages, said circuit comprising:

at least first and second stages in the circuit progressing from the first side of the circuit towards the second side of the circuit,     wherein said first stage includes:
    a first transistor having a gate connected to a first clock pulse terminal, a drain connected to a positive voltage terminal, and a source connected to a first output node;
    a second transistor having a drain connected to the first output node, a gate connected to an external reset terminal, and a source connected to ground; and
    a first capacitor connected to the first output node and to ground in parallel with said second transistor, and     wherein said second stage includes:
    a third transistor having a gate connected to a complement of the first clock pulse terminal, a drain connected to the positive voltage terminal, and a source;
    a fourth transistor having a gate connected to the first output node, a source connected to a second output node, and a drain connected to the source of the third transistor;
    a fifth transistor having a gate connected to the reset terminal, a drain connected to the second output node, and a grounded source; and
    a second capacitor connected to the second output node and to ground in parallel with said fifth transistor.

15. The circuit of claim 14, further comprising circuitry for sequentially providing positive voltage output signals at successive output nodes progressing from the second side of the circuit to the first side of the circuit.

16. The circuit of claim 14, further comprising:

a sixth transistor interposed between the first transistor source and the first output node, said sixth transistor having a drain connected to the first transistor source, a source connected to the first output node, and a gate connected to a means for providing control over the start of positive voltage output signals at successive output nodes.

17. The circuit of claim 16, further comprising a seventh transistor interposed between the first output node and the fourth transistor gate, said seventh transistor having a drain connected to the fourth transistor gate, a source connected to the second transistor drain, and a gate.

18. The circuit of claim 21, further comprising an eighth transistor having a drain connected to the sixth transistor gate and a source connected to the fifth transistor drain.

19. The circuit of claim 18, wherein the seventh transistor gate is connected to a positive voltage and the eighth transistor gate is connected to ground in order for positive voltage output signals to progress from the first side of the circuit toward the second side of the circuit, and wherein the seventh transistor gate is connected to ground and the eighth transistor gate is connected to a positive voltage in order for positive voltage output signals to progress from the second side of the circuit toward the first side of the circuit.

20. The circuit of claim 17, further comprising a ninth transistor having a drain connected to a positive voltage supply, a gate connected to the first output node, and a source connected through additional transistors to ground.

21. The circuit of claim 20 wherein a power output stage is connected to every two adjacent output nodes to permit high speed operation of the circuit.

* * * * *